(12) United States Patent
Pan

(10) Patent No.: US 6,559,013 B1
(45) Date of Patent: May 6, 2003

(54) METHOD FOR FABRICATING MASK ROM DEVICE

(75) Inventor: Jen-Chuan Pan, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/064,397

(22) Filed: Jul. 10, 2002

(30) Foreign Application Priority Data

Jun. 20, 2002 (TW) ........................................ 091113449

(51) Int. Cl.[7] .......................................... H01L 21/8234
(52) U.S. Cl. ..................... 438/275; 438/279; 438/278; 257/390
(58) Field of Search .................. 438/275, 276, 438/277, 278, 279; 257/390, 391, 392, 393

(56) References Cited

U.S. PATENT DOCUMENTS 5,824,585 A * 10/1998 Wen ........................... 438/275

6,372,580 B1 * 4/2002 Shiau ........................ 438/275

* cited by examiner

*Primary Examiner*—Carl Whitehead, Jr.
*Assistant Examiner*—Jack Chen
(74) *Attorney, Agent, or Firm*—Jianq Chyun IP Office

(57) ABSTRACT

A method for fabricating a mask ROM device is described. The method includes forming a buried drain region in a substrate and forming a thick oxide layer on the substrate. Perpendicular to the direction of the buried drain region, a bar-shaped silicon nitride layer is formed on the thick oxide layer. A portion of the thick oxide layer is then removed to expose the substrate, followed by forming a gate oxide layer on the exposed substrate surface for forming a plurality of coded memory cells, wherein the coded memory cells with a gate oxide layer corresponds to a logic state "1" while the code memory cells with a thick silicon oxide layer corresponds to a logic state "0". A polysilicon layer is then formed on the substrate, followed by back-etching the polysilicon layer to expose the bar-shaped silicon nitride layer. After this, the bar-shaped silicon nitride layer is removed.

20 Claims, 7 Drawing Sheets

METHOD FOR FABRICATING MASK ROM DEVICE

CROSS REFERENCE TO RELATED APPLICATIONS

This application claims the priority benefit of Taiwan application Ser. no. 91113449, filed Jun. 20, 2002.

BACKGROUND OF INVENTION

1. Field of the Invention

The present invention relates to a fabrication method for a memory device. More particularly, the present invention relates to a method for fabricating a mask read-only memory (ROM) device.

2. Background of the Invention

Mask ROM device is a very basic type of read-only memory devices, in which an ion implantation process is used to adjust the threshold voltage to achieve the "on" and "off" of the memory cell. When there are changes in the product of a mask ROM device, no dramatic modification is demanded by the manufacturing process. Only one set of photoresist needs to be changed. Therefore the manufacturing of a mask ROM device is suitable for mass production. Actually, a portion of the manufacturing process can be completed first. The programming of the device can be quickly performed soon after an order is placed to move up the delivery/shipping date.

FIGS. 1A to 1C are schematic, cross-sectional views, illustrating the conventional fabrication process of a mask ROM device, wherein FIGS. 1B and 1C are views of a plane perpendicular to the plane in FIG. 1A.

Referring to FIG. 1A, the conventional fabrication process of a mask ROM device includes providing a substrate 100. A gate oxide layer 102 is then formed on the surface of the substrate 100. An ion implantation process 106 is conducted to form a buried drain region 108 in the substrate 100 as the bit line using a patterned photoresist layer 103 as a mask.

Referring to FIG. 1B, after removing the patterned photoresist layer 103, a patterned polysilicon layer 104 is formed on the gate oxide layer 102 as the word line. A patterned photoresist layer 110 is formed on the substrate 100, exposing a channel region 114 to be coded by implantation. Further using a patterned photoresist layer 110 as a mask, a code implantation 112 is performed to implant dopants in the channel region 114.

Thereafter, as shown in FIG. 1C, the photoresist layer 110 is removed to complete the programming of a mask ROM device.

However, in the mask ROM device formed by the conventional approach, the gate oxide layer formed between the substrate and the word line is very thin. The capacitance that is formed between the substrate and the word line can not be effectively reduced to properly improve the RC-delay phenomenon of the memory device. Moreover, the conventional method in programming a mask read-only memory device uses a coding mask and a high-energy ion implantation process to perform the coding implantation. When a misalignment occurs between the memory device and the coding mask, ions can not be accurately implanted to the channel region to be coded, resulting in the tail bit effect.

SUMMARY OF INVENTION

The present invention provides a method to fabricate a mask read-only memory device, wherein the tail bit effect is prevented.

The present invention also provides a fabrication method for a mask read-only memory device, wherein the RC delay phenomenon of the mask ROM device is mitigated.

The present invention provides a fabrication method for a mask ROM device, wherein a first patterned photoresist layer is formed on a substrate. An ion implantation process is conducted using the first photoresist layer as a mask to form a buried drain region in the substrate. A thick oxide layer is then formed on the surface of the substrate to cover the buried drain region subsequent to the removal of the first photoresist layer. Thereafter, a silicon nitride bar, which is perpendicular to the buried drain region is formed on the thick oxide layer. A second patterned photoresist layer is then formed on the silicon nitride bar, exposing a portion of the thick oxide layer. Using the second photoresist layer as an etching mask, the exposed portion of the thick oxide layer is removed to expose the substrate. The second photoresist layer is then removed and a thin oxide layer is formed on the exposed surface of the substrate. A polysilicon layer is then formed on the substrate. Thereafter, a portion of the polysilicon layer is removed by back-etching or chemical mechanical polishing until the silicon nitride bar is exposed for forming a plurality of coded memory cells. The coded memory cells that comprise a thick oxide layer correspond to the logic state "0", while the memory cells that comprise a thick oxide layer correspond to the logic state "1". A metal silicide layer is further formed on the polysilicon layer, followed by removing the silicon nitride bar to complete the programming of a mask ROM device.

The present invention provides a method for fabricating a mask ROM device. The method includes providing a substrate, wherein the substrate comprises a memory cell region and a peripheral circuit region. Moreover, an isolation structure is already formed in the peripheral circuit region to define an active region. A first patterned photoresist layer is then formed on the substrate, covering the entire peripheral circuit region and exposing the part of the substrate that is going to be formed as the buried drain region in the memory cell region. After this, a buried drain region is formed in the substrate of the memory cell region, using the first photoresist layer as an ion implantation mask. A thick oxide layer is then formed on the surface of the substrate subsequent to the removal of the first photoresist layer. A patterned silicon nitride layer is also formed on the thick oxide layer, wherein the silicon nitride layer in the memory cell region includes a plurality of bar-shaped silicon nitride layers formed perpendicular to the buried drain region, while the silicon nitride layer in the peripheral circuit region exposes the active region. A second patterned photoresist layer is then formed on the silicon nitride layer to expose a portion of the thick silicon oxide layer in the memory cell region and the peripheral circuit region. Using the second photoresist layer as an etching mask, the exposed thick silicon oxide layer in the memory cell region and the peripheral circuit region are concurrently removed to expose the substrate. The second photoresist layer is then removed and forming a gate oxide layer on the exposed substrate surface. Thereafter, a polysilicon layer is formed on the substrate. A portion of the polysilicon layer is removed by back-etching or chemical mechanical polishing until the silicon nitride layer is exposed for forming a plurality of coded memory cells in the memory cell region. The coded memory cells that comprise a gate oxide layer in the memory cell region assume a logic state of "1", while the coded memory cells that comprise a thick oxide layer assume the logic state of "0". A metal silicide layer is formed on the surface of the polysilicon layer. The silicon nitride layer is then removed. The polysilicon and the metal silicide structure in the memory cell region forms a word line, while the polysilicon and metal silicide structure in the peripheral circuit region serves as a gate.

According to the fabrication method of a mask ROM device of the present invention, the programming of the mask ROM device is not achieved by code implantation. The tail bit effect generated from a misalignment between the coding mask and the memory device is thus prevented.

According to the fabrication method for a mask ROM device, the memory cells that assume the logic state of "0" comprise a thick silicon oxide layer. Since the gate the thick oxide layer is thicker than the gate oxide layer, the capacitance between the word line and the substrate is lower to reduce the RC delay effect of a memory device.

Since the programming in the fabrication of a mask ROM device of the present invention is not achieved through coding implantation, the cell window of a memory device is greatly increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings, FIGS. 1A to 1C are schematic, cross-sectional views illustrating the conventional fabrication method for a mask ROM device, wherein FIGS. 1B and 1C are views of a plane perpendicular to the plane in FIG. 1A;

DETAILED DESCRIPTION

Figure 1A:
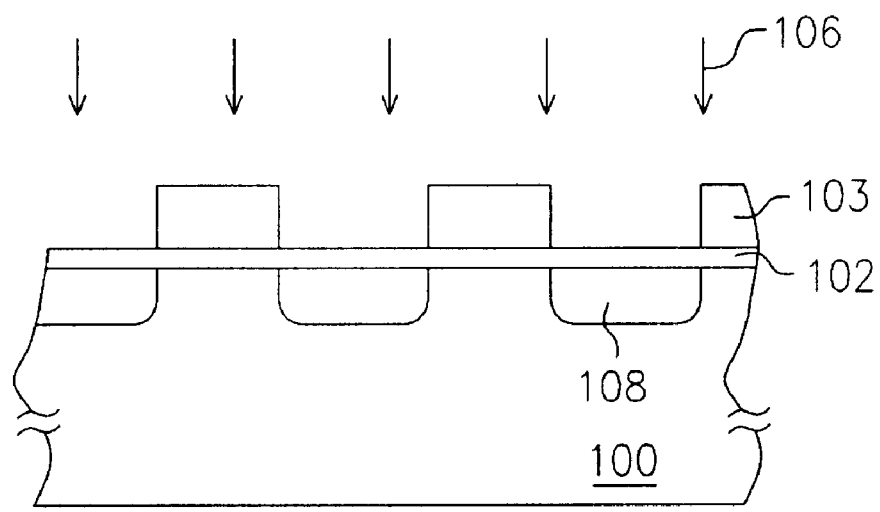
Figure 1B:
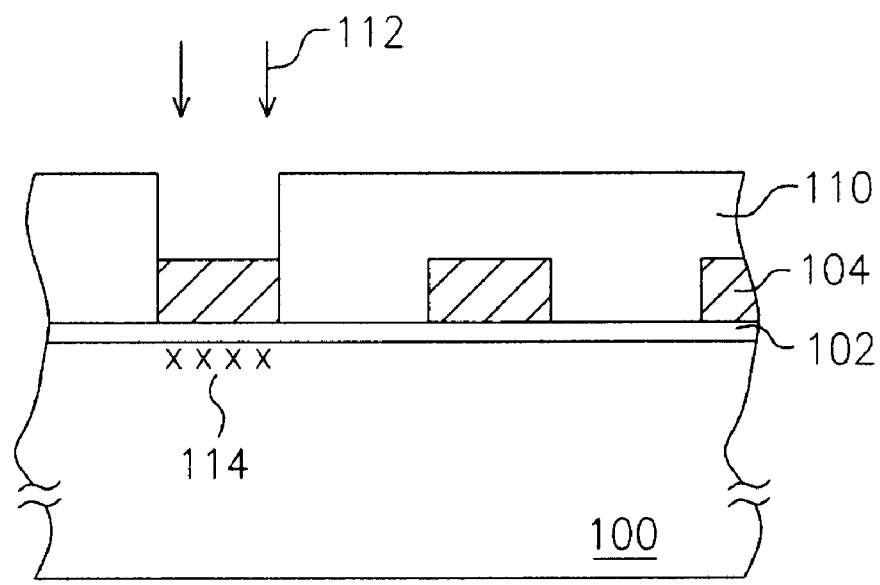
Figure 1C:
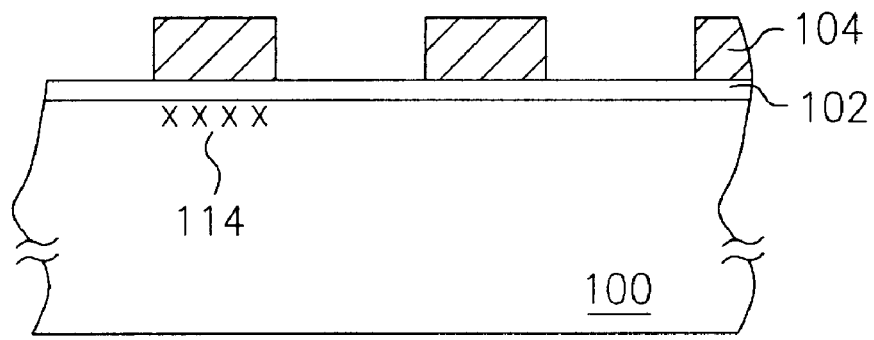
Figure 2:
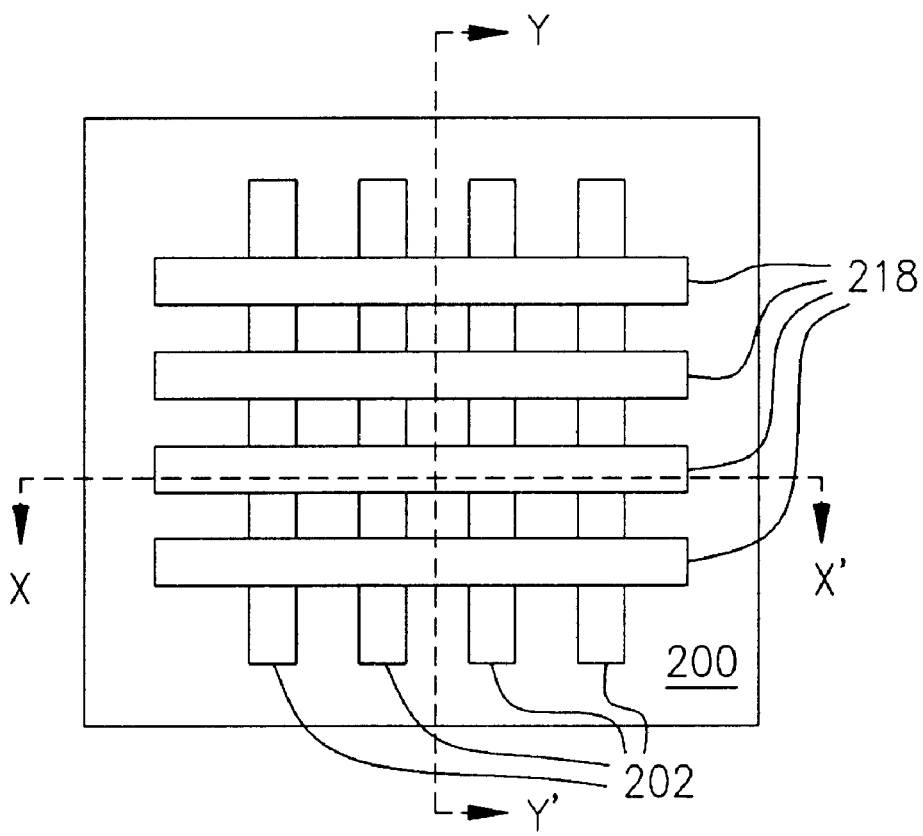
FIG. 2 is a schematic top view of a mask ROM device according to one embodiment of the present invention.

FIG. 2 is a schematic top view of a mask ROM device according to one embodiment of the present invention. FIGS. 3A to 3J are schematic, cross-sectional views of FIG. 2 along the X–X" and Y–Y" lines to illustrate the fabrication process for a mask ROM device according to the one embodiment of the present invention.

Figure 3A:
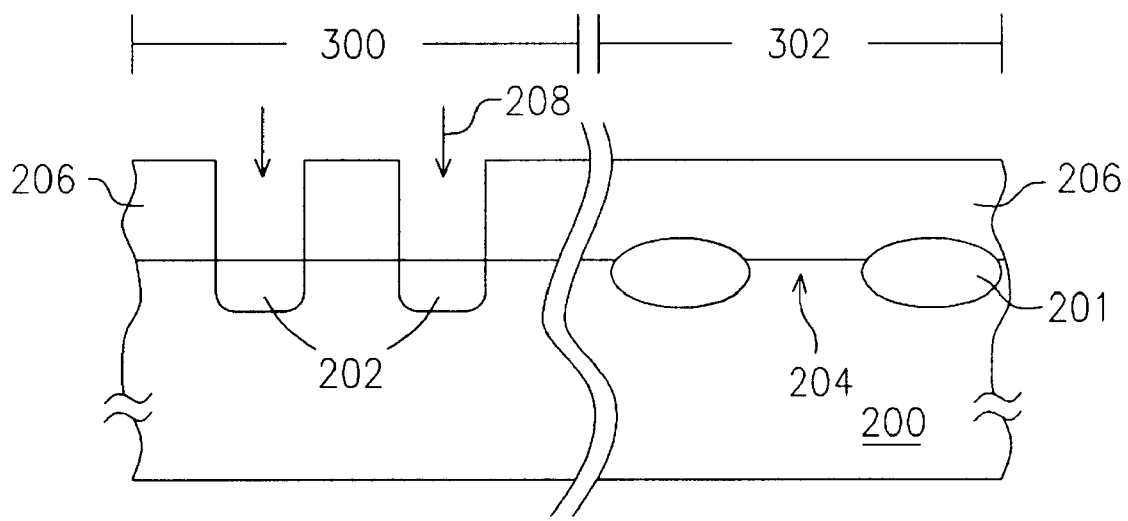
FIGS. 3A to 3J are schematic, cross-sectional views illustrating the fabrication process for a mask ROM device according to the one embodiment of the present invention.

Referring to FIG. 2 and FIG. 3A, FIG. 3A is the cross-sectional view of FIG. 2 along the X–X" line. The fabrication method for a mask ROM device of the present invention provides a substrate 200, wherein the substrate 200 comprises a memory cell region 300 and a peripheral circuit region 302. An isolation structure 201 is already formed in the peripheral circuit region 302 to define an active region 204. The isolation structure 201 is, for example, a field oxide isolation structure or a shallow trench isolation structure.

A patterned photoresist layer 206 is formed on the substrate 200, wherein at the bottom of the photoresist layer 206 further comprises an anti-reflecting coating (not shown). The photoresist layer 206 in the memory cell region exposes the substrate 200 where the buried drain region is going to be formed, while the photoresist layer 206 covers the entire peripheral circuit region 302. Using the photoresist layer 206 as a mask, an ion implantation process 208 is conducted to form a buried drain region 202 in the substrate 200 of the memory cell region 300 as the bit line. The ion implantation process 208 is conducted at an energy level of about 80keV and the dopants implanted for the buried drain region 202 include arsenic ions.

Figure 3B:
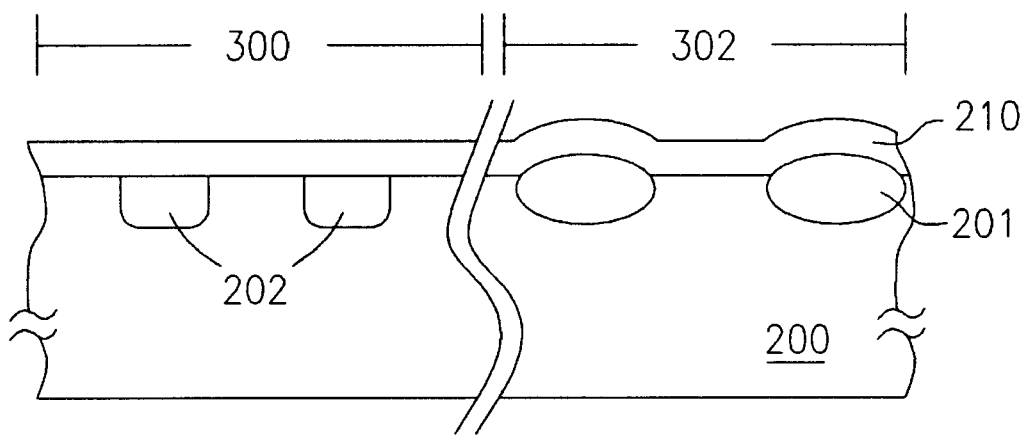

Referring to FIG. 3B, FIG. 3B is a cross-sectional of FIG. 2 along the X–X" line. Subsequent to the formation of the buried drain region 202, the photoresist layer 206 is removed. A thick dielectric layer 210 is then formed on the substrate 200. The thick dielectric layer 210 is, for example, a thick silicon oxide layer. The thick oxide layer is about 1000 angstroms to 2000 angstroms thick.

Figure 3C:
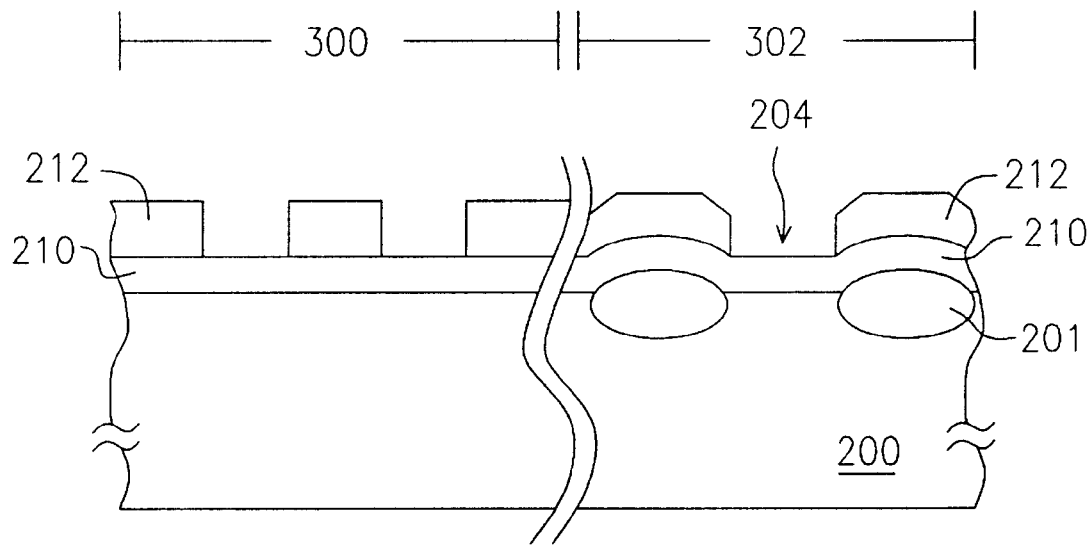

Continuing to FIG. 3C, FIG. 3C is a cross-sectional view of FIG. 2 along the Y–Y" line. A patterned silicon nitride layer 212 is formed on the thick silicon oxide layer 210, wherein the silicon nitride layer 212 can be replaced by other material that has a high etching selectivity with the oxide layer 210. The silicon nitride layer 212 is about 1000 angstroms to about 2000 angstroms thick. The silicon nitride layer 212 in the memory cell region includes a plurality of bar-shaped silicon nitride layers 212 that are perpendicular to the buried drain region 202. Moreover, the silicon nitride layer 212 in the peripheral circuit region 302 exposes the thick oxide layer 210 in the active region 204.

Figure 3D:
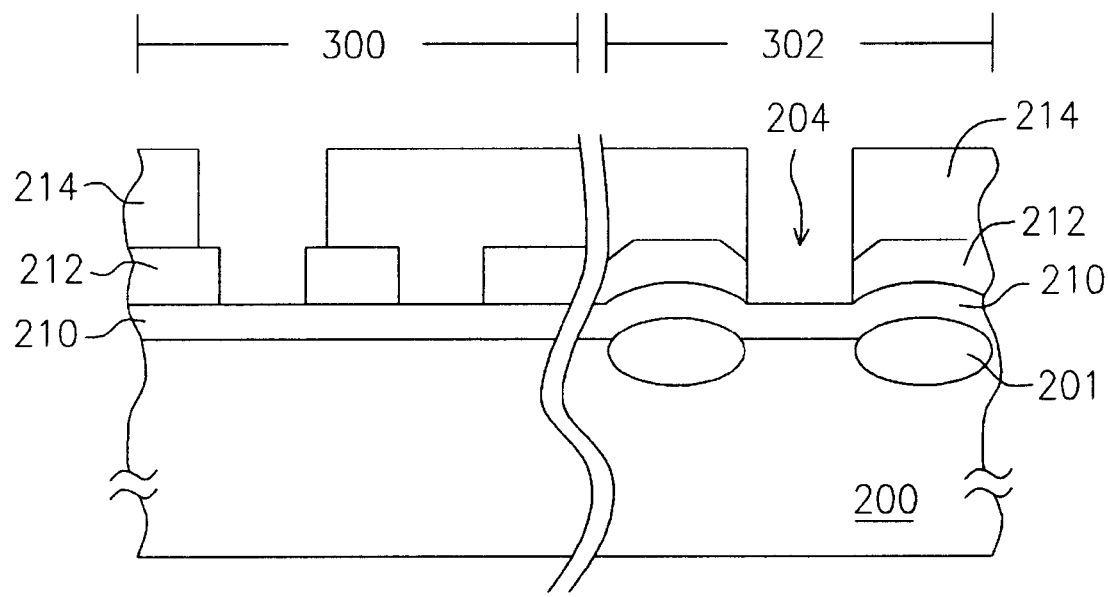

Referring to FIG. 3D, which is a cross-sectional view of FIG. 2 along the Y–Y" line, a patterned photoresist layer 214 is then formed on the silicon nitride layer 212. The bottom of the patterned photoresist layer 214 further comprises an anti-reflecting coating (now shown). The photoresist layer 214 exposes a portion of the thick oxide layer 210 in the memory cell region 300, exposes the thick silicon oxide layer 210 in the active region in the peripheral circuit region 302.

Figure 3E:
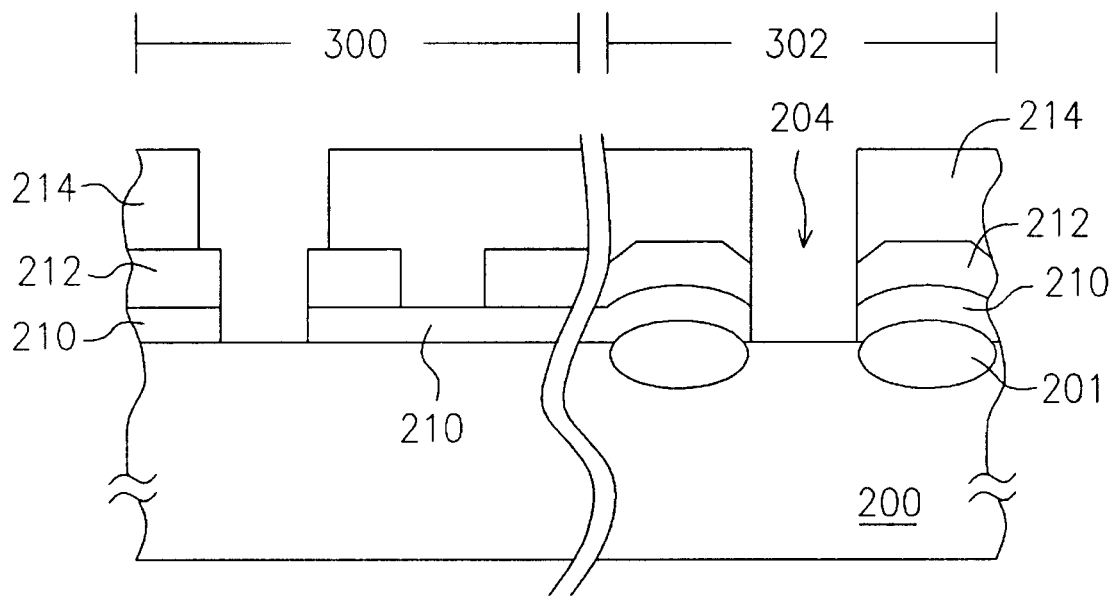

After this, refer to FIG. 3E, wherein FIG. 3E is a cross-sectional view of FIG. 2 along the Y–Y" line. Using the photoresist layer 214 as an etching mask, the thick oxide layer 210 not covered by the photoresist layer 214 is removed to expose the substrate 200. A portion of the thick oxide layer 210 in the memory cell region 300 is removed while other portion of the thick oxide layer 210 in the memory cell region 300 is retained. The thick oxide layer 210 in the active region 204 in the peripheral circuit region 302 is completely removed.

Figure 3F:
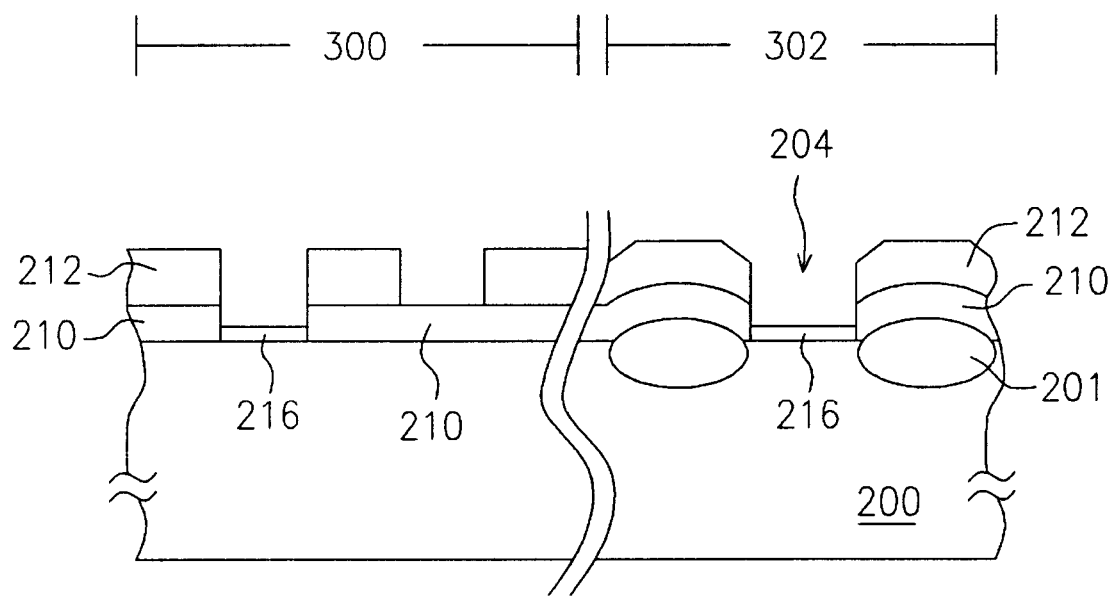

As shown in FIG. 3F, where FIG. 3F is a cross-sectional view of FIG. 2 along the Y–Y" line, a thermal process is conducted after the photoresist layer 214 is removed. A gate oxide layer 216 is formed on the exposed surface of the substrate 200 for the subsequently formed plurality of coded memory cells in the memory cell region 300. The gate oxide layer 216 is about 30 to 70 angstroms thick. The gate oxide layer 216 in the peripheral circuit region 302 is then served as the gate insulation layer for isolating the subsequently formed gate structure.

Figure 3G:
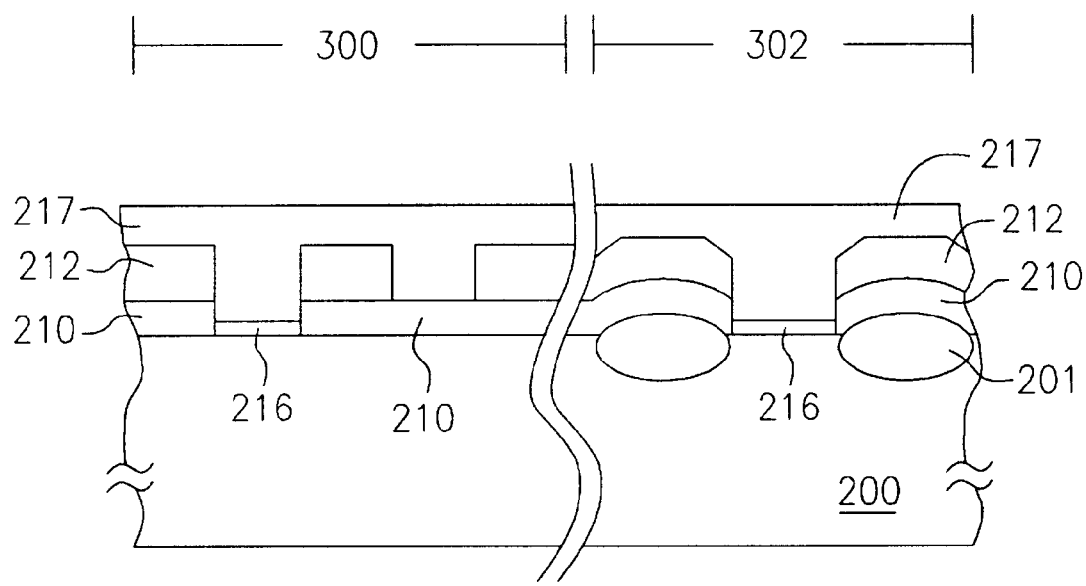

Referring to FIG. 3G, where FIG. 3G is a cross-sectional view of FIG. 2 along the Y–Y" line. A conductive layer 217 is formed on the substrate 200 to cover the silicon nitride layer 212, wherein the conductive layer 217 is a polysilicon layer with a thickness of about 3000 to 5000 angstroms.

Figure 3H:
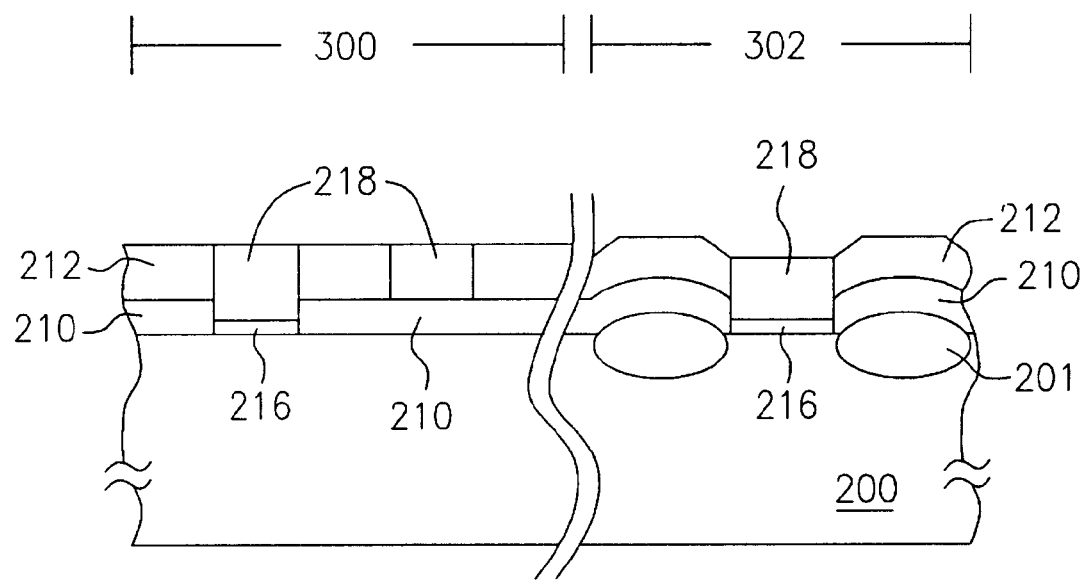

After this, as shown in FIG. 3H, where 3H is a cross-sectional view of FIG. 2 along the Y–Y" line, a portion of the conductive layer 217 is removed until the silicon nitride layer 212 is exposed to form a conductive structure 218. Removing the portion of the conductive layer 217 is, for example, by back-etching or chemical mechanical polishing. The coded memory cells that comprise a gate oxide layer 216 in the memory cell region have a lower threshold voltage to assume a logic state "1". The coded memory cells that comprise the thick oxide layer 210, on the other hand, assume a logic state "0". The conductive structure 218 is about 600 to 1500 angstroms thick. The conductive structure 218 in the memory cell region 300 serves as a word line, while the conductive structure 218 in the peripheral circuit region 302 serves as a gate structure.

Figure 3I:
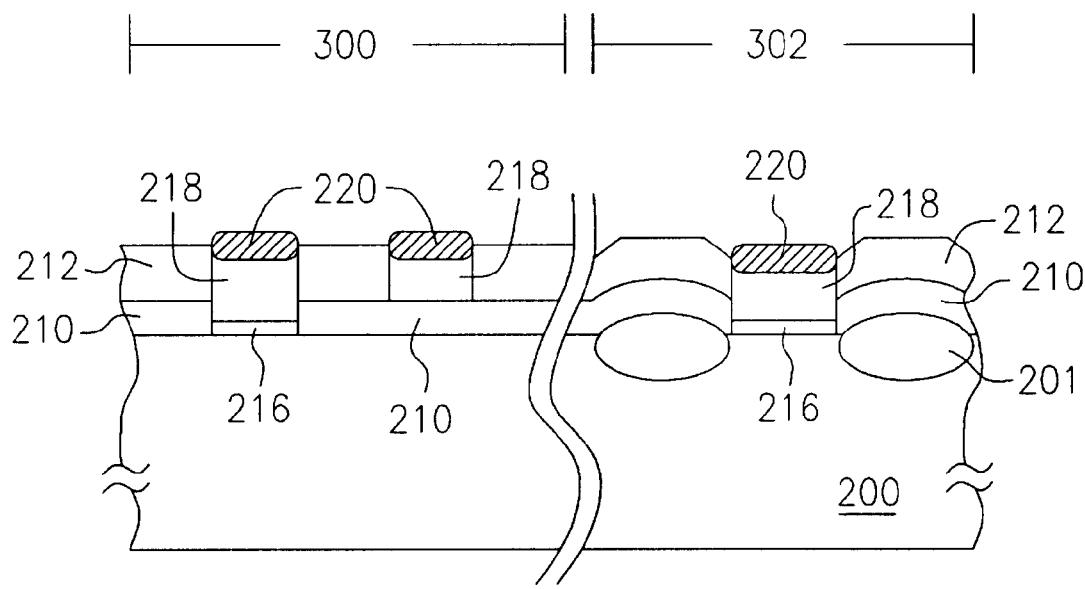

Referring to FIG. 3I, where FIG. 3I is a cross-sectional view of FIG. 2 along the line Y–Y". The present invention further comprises forming a metal silicide layer 220 on the polysilicon type of conductive structure 218 to lower the resistance of the word line in the memory cell region 300 and the resistance of the gate structure in the peripheral circuit region 302. The metal silicide layer 220 is formed by, for example, forming a metal layer (not shown) on the polysilicon conductive structure 218 and silicon nitride layer 212, followed by performing a thermal process to induce a reaction between the metal layer and the polysilicon layer to form a metal silicide layer. The unreacted metal layer is subsequently removed.

Figure 3J:
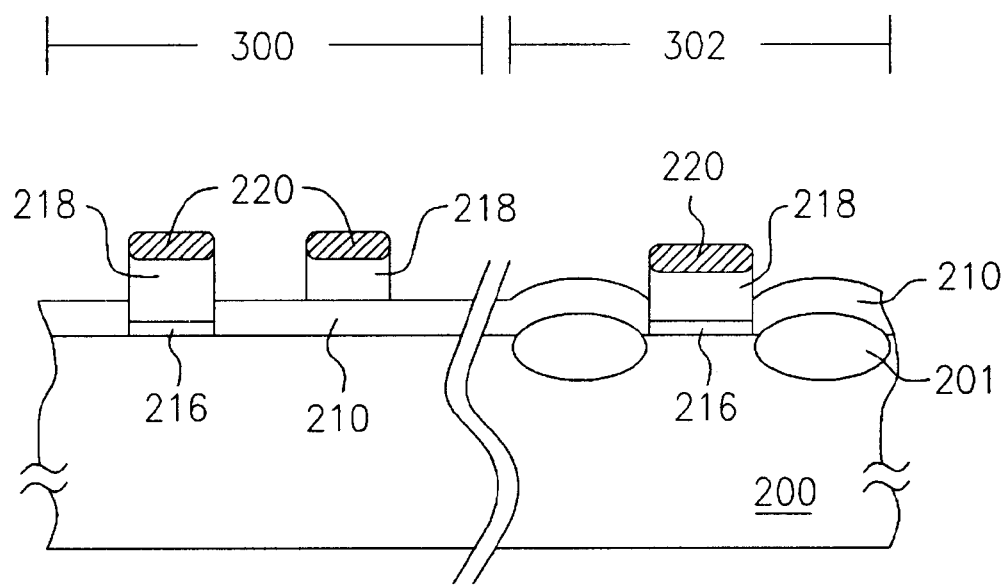

Thereafter, as shown in FIG. 3J where 3J is a cross-sectional view of FIG. 2 along the Y–Y" line, the silicon nitride layer 212 is removed to complete the fabrication of a mask ROM device of the present invention.

According to the fabrication method for a mask ROM device of the present invention, the mask ROM device defines its logic state "0" and "1" based on the thickness variation between the thick oxide layer 210 and the gate oxide layer 216. Since the programming step can completely avoid the conventional ion coding implantation method, the tail bit effect generated from the misalignment between the coding mask and the memory device is prevented. Moreover, since the logic state of "0" in a mask ROM memory device corresponds to the memory cells that comprise a thick silicon oxide layer 210 and the thick silicon oxide layer 210 is thicker than the gate oxide layer 216. The capacitance between the word line 218 and the substrate 200 is thus reduced to lower the RC delay effect of the memory device. Since the RC delay effect of the memory device can be improved, the operational speed of the device is thereby increased. Further, since the programming step of the mask ROM memory device of the present invention can completely avoid the conventional ion coding implantation method, the cell window of the memory device according to the method of the present invention is thus increased.

Based on the foregoing description, the fabrication method of a mask ROM device of the present invention can avoid the tail bit effect that easily generated in the conventional fabrication method.

The mask ROM device formed according to the present invention, the RC delay of the memory device is greatly reduced to increase the operational speed of the device.

Further, the fabrication method for a mask ROM device according to the present invention can increase the cell window of a memory device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a mask ROM device, comprising:
    forming a buried drain region in a substrate;
    forming a first dielectric layer on the substrate;
    forming a bar-shaped second dielectric layer on the first dielectric layer, the bar-shaped second dielectric layer is perpendicular to a direction of the buried drain region;
    removing a portion of the first dielectric layer to expose the substrate;
    forming a gate oxide layer on the exposed substrate surface;
    forming a conductive layer on the substrate to cover the bar-shaped second dielectric layer;
    removing a portion of the conductive layer until the bar-shaped second dielectric layer is exposed to form a plurality of coded memory cells, wherein the coded memory cells that comprise the gate oxide layer correspond to a logic state of "1" while the coded memory cells that comprise the first dielectric layer correspond to a logic state of "0"; and
    removing the bar-shaped second dielectric layer.

2. The method of claim 1, wherein the first dielectric layer and the bar-shaped second dielectric layer comprise an etching selectivity.

3. The method of claim 1, wherein the first dielectric layer includes a silicon oxide layer.

4. The method of claim 1, wherein the first dielectric layer is about 1000 angstroms to 2000 angstroms thick.

5. The method of claim 1, wherein the bar-shaped second dielectric layer includes a bar-shaped silicon nitride layer.

6. The method of claim 1, wherein the bar-shaped second dielectric layer is about 1000 angstroms to 2000 angstroms thick.

7. The method of claim 1, wherein the gate oxide layer is about 30 angstroms to 70 angstroms thick.

8. The method of claim 1, wherein the conductive layer includes a polysilicon layer.

9. The method of claim 8, wherein after removing a portion of the polysilicon layer to expose the bar-shaped second dielectric layer further comprises forming a metal silicide layer on the polysilicon layer.

10. The method of claim 1, wherein removing the portion of the conductive layer includes performing chemical mechanical polishing or back-etching.

11. A fabrication method of the mask ROM device, comprising:
    providing a substrate, wherein the substrate comprises a memory cell region and a peripheral circuit region, and the peripheral circuit region already comprises an isolation structure to define an active region;
    forming a buried drain region in the substrate of the memory cell region;
    forming a first dielectric layer on the substrate;
    forming a patterned second dielectric layer on the first dielectric layer, wherein the second dielectric layer in the memory cell region includes a plurality of bar-shaped dielectric structures perpendicular to the buried drain region and the second dielectric layer in the peripheral circuit region exposes the first dielectric layer in the active region;
    removing a portion of the first dielectric layer in the memory cell region to expose the substrate and removing the exposed first dielectric layer in the peripheral circuit region to expose the substrate;

forming a gate oxide layer on the exposed substrate surface;

forming a conductive layer on the substrate to cover the second dielectric layer;

removing a portion of the conductive layer until the second dielectric layer is exposed to form a plurality of coded memory cells, wherein the coded memory cells that comprise a gate oxide layer corresponds to a logic state of "1" while the code memory cells that comprise the first dielectric layer corresponds to a logic state of "0"; and removing the second dielectric layer.

12. The method of claim 11, wherein first dielectric layer and the second dielectric layer comprise an etching selectivity.

13. The method of claim 11, wherein the first dielectric layer includes a silicon oxide layer.

14. The method of claim 11, wherein the first dielectric layer is about 1000 angstroms to about 2000 angstroms thick.

15. The method of claim 11, wherein the bar-shaped second dielectric layer includes a bar-shaped silicon nitride layer.

16. The method of claim 11, wherein the bar-shaped second dielectric layer is about 1000 angstroms to 2000 angstroms thick.

17. The method of claim 11, wherein the gate oxide layer is about 30 angstroms to 70 angstroms thick.

18. The method of claim 11, wherein the conductive layer includes a polysilicon layer.

19. The method of claim 18, wherein removing the portion of the polysilicon layer to expose the bar-shaped second dielectric layer further comprises forming a metal silicide layer on the polysilicon layer.

20. The method of claim 11, wherein removing the portion of the polysilicon layer includes performing chemical mechanical polishing or back-etching.

* * * * *